United States Patent
Chen et al.

(10) Patent No.: US 12,369,427 B1
(45) Date of Patent: Jul. 22, 2025

(54) METAL-SEMICONDUCTOR CONTACT STRUCTURE AND PREPARATION METHOD THEREFOR, SOLAR CELL, SOLAR CELL STRING AND PREPARATION METHOD THEREFOR, AND PHOTOVOLTAIC MODULE

(71) Applicant: Tongwei Solar (Chengdu) Co., Ltd., Sichuan (CN)

(72) Inventors: Yang Chen, Chengdu (CN); Jianbin Fan, Chengdu (CN); Xiajie Meng, Chengdu (CN)

(73) Assignee: TONGWEI SOLAR (CHENGDU) CO., LTD., Chengdu (CN)

( * ) Notice: Subject to any disclaimer, the term of this patent is extended or adjusted under 35 U.S.C. 154(b) by 0 days.

(21) Appl. No.: 18/933,640

(22) Filed: Oct. 31, 2024

(30) Foreign Application Priority Data

Jun. 4, 2024 (CN) .......................... 202410718635.9

(51) Int. Cl.
*H10F 77/20* (2025.01)
*H10F 71/00* (2025.01)
(Continued)

(52) U.S. Cl.
CPC ......... *H10F 77/219* (2025.01); *H10F 71/103* (2025.01); *H10F 71/1221* (2025.01);
(Continued)

(58) Field of Classification Search
None
See application file for complete search history.

(56) References Cited

U.S. PATENT DOCUMENTS

| | | |
|---|---|---|
| 11,482,634 B1 | 10/2022 | Zhang et al. |
| 2017/0186893 A1* | 6/2017 | Chaudhari .......... H01L 21/0242 |
| 2022/0344528 A1 | 10/2022 | Zhang et al. |

FOREIGN PATENT DOCUMENTS

| | | |
|---|---|---|
| CN | 116759465 A | 9/2023 |
| CN | 117253649 A | 12/2023 |

(Continued)

OTHER PUBLICATIONS

First Office Action dated Oct. 23, 2024 received in Chinese Patent Application No. 202410718635.9.
(Continued)

*Primary Examiner* — Eli S Mekhlin
(74) *Attorney, Agent, or Firm* — Scully, Scott, Murphy & Presser, P.C.

(57) ABSTRACT

A metal-semiconductor contact structure is provided. The metal-semiconductor contact structure includes a doped silicon-based semiconductor layer and a metal electrode in contact with each other. A contact region between the doped silicon-based semiconductor layer and the metal electrode includes a first conductive region and a second conductive region. In the first conductive region, the metal electrode is recessed towards an inner direction of the doped silicon-based semiconductor layer to form a pit island, a silicon-based eutectic in conductive connection with the doped silicon-based semiconductor layer is provided in the pit island, and a conductive crystal in conductive connection with the silicon-based eutectic is provided. A conductive aggregate including a glass phase material and metal conductive particles is provided in the second conductive region, and the metal conductive particles have a same kind of the metal element as the conductive crystal.

20 Claims, 5 Drawing Sheets

(51) Int. Cl.
*H10F 71/10* (2025.01)
*H10F 77/70* (2025.01)

(52) U.S. Cl.
CPC ....... *H10F 71/1375* (2025.01); *H10F 77/247* (2025.01); *H10F 77/251* (2025.01); *H10F 77/703* (2025.01)

(56) References Cited

FOREIGN PATENT DOCUMENTS

| | | |
|---|---|---|
| CN | 117374153 A | 1/2024 |
| CN | 117766623 A | 3/2024 |
| CN | 117790621 A | 3/2024 |
| CN | 117790622 A | 3/2024 |
| CN | 118039738 A | 5/2024 |
| JP | 2016103642 A | 6/2016 |

OTHER PUBLICATIONS

Notification to grant Patent Right for Invention dated Nov. 18, 2024 received in Chinese Patent Application No. 202410718635.9.
Groser, S. et al. "Microscale Contact Formation by Laser Enhanced Contact Optimization", IEEE Journal of Photovoltaics, Jan. 2022, pp. 26-30, vol. 12, No. 1.
Extended European search report dated Apr. 4, 2025 received in European Patent Application No. 24209791.3.

* cited by examiner

METAL-SEMICONDUCTOR CONTACT STRUCTURE AND PREPARATION METHOD THEREFOR, SOLAR CELL, SOLAR CELL STRING AND PREPARATION METHOD THEREFOR, AND PHOTOVOLTAIC MODULE

CROSS-REFERENCE TO RELATED APPLICATION

This application claims priority to Chinese Patent Application No. 202410718635.9, filed on Jun. 4, 2024, entitled "METAL-SEMICONDUCTOR CONTACT STRUCTURE AND PREPARATION METHOD THEREOF, SOLAR CELL, SOLAR CELL STRING AND PREPARATION METHOD THEREOF, AND PHOTOVOLTAIC MODULE", which is incorporated herein by reference in its entirety.

TECHNICAL FIELD

The present application relates to the field of solar cells, and in particular to a metal-semiconductor contact structure and a preparation method thereof, a solar cell, a solar cell string and preparation method thereof, and a photovoltaic module.

BACKGROUND

The metal-semiconductor contact structure is a structure formed by contacting a metal electrode with a doped silicon-based semiconductor layer in a solar cell. As an important component of solar cells, metal-semiconductor contact structures have a significant impact on the performance of solar cells.

At present, in the metal-semiconductor contact structure of solar cell, the conductive contact performance between metal material and semiconductor material is not ideal, which shows that the contact resistance of the conductive contact region is larger, resulting in that the electrical performance indexes such as open circuit voltage and photoelectric conversion efficiency of solar cell cannot be substantially improved.

SUMMARY

In order to solve the above-mentioned technical problem, the present application discloses a metal-semiconductor contact structure and a preparation method thereof, a solar cell, a solar cell string and a preparation method thereof, and a photovoltaic module, which can effectively improve a contact performance of a conductive contact region of the metal-semiconductor contact structure and optimize performances of the solar cell.

In a first aspect, the present application provides a metal-semiconductor contact structure including:
  a doped silicon-based semiconductor layer;
  and a metal electrode, wherein the metal electrode and the doped silicon-based semiconductor layer are in contact with each other, and the metal electrode has a metal element;
  wherein a contact region is provided between the doped silicon-based semiconductor layer and the metal electrode, and the contact region includes a first conductive region and a second conductive region located outside the first conductive region;

in the first conductive region, the metal electrode is recessed towards an inner direction of the doped silicon-based semiconductor layer to form a pit island, a silicon-based eutectic is provided in the pit island, the silicon-based eutectic is in conductive connection with the doped silicon-based semiconductor layer, and a conductive crystal in conductive connection with the silicon-based eutectic is further provided in the first conductive region;

a conductive aggregate is provided in the second conductive region, the conductive aggregate includes a glass phase material and metal conductive particles, and the metal conductive particles have a same kind of the metal element as the conductive crystal.

Further, a portion of the metal conductive particles are located on a surface of the doped silicon-based semiconductor layer, another portion of the metal conductive particles are distributed in the glass phase material, and the conductive aggregate is in contact with the doped silicon-based semiconductor layer through the metal conductive particles.

Further, the pit island includes a number of holes and pits located at the periphery of the holes.

Further, a distribution density of the holes is $1/\mu m^2$ to $50/\mu m^2$; and/or,
a hole diameter of the holes is 10 nm to 100 nm.

Further, a surface of an area of the pit island has a higher roughness than the second conductive region.

Further, the surface of the doped silicon-based semiconductor layer has a pyramid textured structure, and the pit island is located at or near a tip of the pyramid textured structure.

Further, the metal electrode includes a silver electrode.

Alternatively, the doped silicon-based semiconductor layer includes one of a doped amorphous silicon layer, a doped polysilicon layer, a doped microcrystalline silicon layer or a doped crystalline silicon layer, the doping element includes an N-type doping element or a P-type doping element, the N-type doping element includes at least one of a phosphorus element, an antimony element or an arsenic element, and the P-type doping element includes at least one of a boron element, an indium element or a gallium element.

Further, the conductive crystal includes a crystalline main chain and a crystalline side chain extending from the crystalline main chain toward a direction different from a growth direction of the crystalline main chain.

Further, a size of the conductive crystal is 1 nm to 30 nm.

In a second aspect, the present application provides a preparation method of a metal-semiconductor contact structure, wherein the metal-semiconductor contact structure is the metal-semiconductor contact structure according to the first aspect, and the preparation method of the metal-semiconductor contact structure includes the steps of:
  printing an electrode paste on the doped silicon-based semiconductor layer; the electrode paste includes a glass phase material, metal particles, and an organic carrier;
  pre-sintering the electrode paste at a high temperature, so that part of a surface of the doped silicon-based semiconductor layer forms the pit island, and forming an electrode precursor on the doped silicon-based semiconductor layer; wherein the electrode precursor includes the glass phase material and the metal conductive particles packaged in the glass phase material;
  performing laser-induced contact treatment on the electrode precursor to form the metal electrode, and the metal electrode and the semiconductor layer forming the metal-semiconductor contact structure.

Further, in the step of pre-sintering the electrode paste, a sintering temperature is 700° C. to 850° C.

Further, in the step of performing laser-induced contact treatment, a reverse bias voltage of 9 V to 15 V is applied.

Further, the step of performing laser-induced contact treatment on the electrode precursor includes applying a reverse bias voltage, and conditions of the laser-induced contact treatment include a single wavelength spectrum having a wavelength of 500 nm to 1200 nm, a current density of 1000 A/cm$^2$ to 1400 A/cm$^2$, and a scanning rate of 35 m/s to 55 m/s.

Further, the preparation method of the metal-semiconductor contact structure further includes: performing light injection after the step of pre-sintering the electrode paste at a high temperature and before the step of performing laser-induced contact treatment on the electrode precursor;

or, the preparation method of the metal-semiconductor contact structure further includes: performing light injection after the step of performing laser-induced contact treatment on the electrode precursor.

Further, the step of light injection includes:

primarily heating of the electrode precursor, wherein a peak temperature of the primary heating is 200° C. to 600° C.;

secondary heating of the electrode precursor and illumination, wherein a peak temperature of the secondary heating is 100° C. to 300° C., an energy density of the illumination is 10 kW/m$^2$ to 100 kW/m$^2$, and a wavelength of the illumination is a continuous spectral band of 500 nm to 1200 nm.

In a third aspect, the present application provides a solar cell including the metal-semiconductor contact structure according to the first aspect, or including the metal-semiconductor contact structure prepared by the preparation method according to the second aspect.

Alternatively, the solar cell includes a PERC cell, an HJT cell, a TOPCon cell, an IBC cell, or a perovskite-crystalline silicon stack solar cell.

In one optional implementation, the solar cell is a TOPCon cell, and the solar cell includes:

a silicon substrate;

a PN junction region, a first passivation layer, and a first metal electrode sequentially provided on a light-receiving surface of the silicon substrate in a direction away from the light-receiving surface, wherein the PN junction region is a first doped silicon-based semiconductor layer;

a passivation contact structure, a second passivation layer and a second metal electrode sequentially provided on a backlight surface of the silicon substrate in a direction away from the backlight surface, wherein the passivation contact structure includes a tunneling passivation layer provided close to the silicon substrate and a doped silicon layer provided away from the silicon substrate, the doped silicon layer has a same conductivity type as the silicon substrate, and the doped silicon layer is a second doped silicon-based semiconductor layer;

the first metal electrode penetrates a portion of the first passivation layer into contact with the first doped silicon-based semiconductor layer so that the PN junction region and the first metal electrode form the metal-semiconductor contact structure, and/or, the second metal electrode penetrates the second passivation layer into contact with the doped silicon layer so that the doped silicon layer and the second metal electrode form the metal-semiconductor contact structure;

Further, the first doped silicon-based semiconductor layer is formed by performing thermal diffusion of the doping element to the silicon substrate, or the first doped silicon-based semiconductor layer is a doped polysilicon layer or a doped amorphous silicon layer deposited on the light-receiving surface of the silicon substrate; and/or, the first passivation layer is one or more of an aluminum oxide layer, a silicon oxide layer, a silicon oxynitride layer, or a silicon nitride layer deposited on the PN junction region; and/or, the tunneling passivation layer is at least one of a silicon oxide layer, an amorphous silicon layer, a polycrystalline silicon layer, and a silicon carbide layer; and/or, the second passivation layer is one or more of a silicon oxide layer, a silicon oxynitride layer, or a silicon nitride layer deposited on the second doped silicon-based semiconductor layer.

In one optional implementation, the solar cell is an HJT cell, and the solar cell includes:

a silicon substrate;

a first intrinsic amorphous silicon layer, a first doped silicon-based semiconductor layer, a first transparent conductive layer sequentially provided on a light-receiving surface of the silicon substrate, and a first metal electrode disposed on the light-receiving surface of the silicon substrate;

a second intrinsic amorphous silicon layer, a second doped silicon-based semiconductor layer, a second transparent conductive layer sequentially provided on a backlight surface of the silicon substrate, and a second metal electrode disposed on the backlight surface of the silicon substrate;

wherein the first metal electrode, the first doped silicon-based semiconductor layer and the first transparent conductive layer form the metal-semiconductor contact structure, and/or the second metal electrode, the second doped silicon-based semiconductor layer and the second transparent conductive layer form the metal-semiconductor contact structure.

Further, the first intrinsic amorphous silicon layer includes one or more layers of an intrinsic amorphous silicon layer, a hydrogenated amorphous silicon layer, and a silicon oxide layer; and/or, the first doped silicon-based semiconductor layer is one or more doped silicon layers; and/or, the first transparent conductive layer is one or more of an indium tin oxide layer, an aluminum-doped zinc oxide layer, a zinc oxide layer, an indium oxide layer, and a tin oxide layer; and/or, the second intrinsic amorphous silicon layer includes one or more of an intrinsic amorphous silicon layer and a hydrogenated amorphous silicon layer; and/or, the second doped silicon-based semiconductor layer is one or more doped silicon layers; and/or, the second transparent conductive layer is one or more of an indium tin oxide layer, an aluminum-doped zinc oxide layer, a zinc oxide layer, an indium oxide layer, and a tin oxide layer.

In one optional implementation, the solar cell is a PERC solar cell, and the solar cell includes:

a silicon substrate;

a first doped silicon-based semiconductor layer and a first passivation layer sequentially formed on a light-receiving surface of the silicon substrate;

a first metal electrode penetrating the first passivation layer and forming the metal-semiconductor contact structure with the first doped silicon-based semiconductor layer;

Further, the first doped silicon-based semiconductor layer is one or more doped silicon layers; and/or, the solar cell further includes a second doped silicon-based semiconductor layer and a backside field passivation layer sequentially provided on a backlight surface of the silicon substrate, and a second metal electrode is further provided on a side of the backlight surface of the silicon substrate, and the second metal electrode is in ohmic contact with the second doped silicon-based semiconductor layer.

In one optional implementation, the solar cell is an IBC solar cell, and the solar cell includes:

a silicon substrate;

a tunneling passivation layer, a first doped silicon-based semiconductor layer, a first passivation layer, and a first metal electrode sequentially provided on an N-type conductive region of a backlight surface of the silicon substrate;

the tunneling passivation layer, a second doped silicon-based semiconductor layer, a second passivation layer, and a second metal electrode sequentially provided on a P-type conductive region of the backlight surface of the silicon substrate; one layer of the first doped silicon-based semiconductor layer and the second doped silicon-based semiconductor layer has an N-type doping element and the other layer has a P-type doping element;

wherein the first metal electrode penetrates the first passivation layer and contacts the first doped silicon-based semiconductor layer, so that the first metal electrode and the first doped silicon-based semiconductor layer form the metal-semiconductor contact structure, and/or, the second metal electrode penetrates the second passivation layer and contacts the second doped silicon-based semiconductor layer, so that the second metal electrode and the second doped silicon-based semiconductor layer form the metal-semiconductor contact structure.

In a fourth aspect, the present application provides a preparation method of a solar cell string including the steps of:

welding a plurality of solar cells according to the third aspect to form a cell string precursor;

performing the laser-induced contact treatment on the cell string precursor to obtain the solar cell string.

Further, in the step of performing laser-induced contact treatment on the cell string precursor, a voltage of the reverse bias voltage is 10 V to 50 V; and/or, a wavelength of the laser is 500 nm to 1200 nm; and/or, an energy density of the laser is 10 kW/m² to 10000 kW/m²; and/or, a scanning rate of the laser is between 26 m/s to 65 m/s.

In a fifth aspect, the present application provides a solar cell string prepared by the preparation method of a solar cell string according to the fourth aspect.

In a sixth aspect, the present application provides a photovoltaic module including the solar cell string according to the fifth aspect.

Compared with the prior art, the present application has at least the following beneficial effects:

The embodiments of the present application provide a metal-semiconductor contact structure with a new structure, which has a rich conductive structure type and an excellent conductive capability, can effectively improve a contact performance between a metal electrode and a doped silicon-based semiconductor layer, reduce a contact resistance therebetween, improve a carrier transport capability, and effectively improve indexes such as an open circuit voltage, a filling factor and a photoelectric conversion efficiency of the solar cell.

BRIEF DESCRIPTION OF THE DRAWINGS

To describe the technical solutions in embodiments of the present application more clearly, the following briefly describes the accompanying drawings for the embodiments. It is clear that the accompanying drawings in the following description show merely some embodiments of the present application, and a person of ordinary skill in the art may derive other drawings from these accompanying drawings without creative efforts.

DESCRIPTION OF THE REFERENCE NUMERALS

Figure 1:
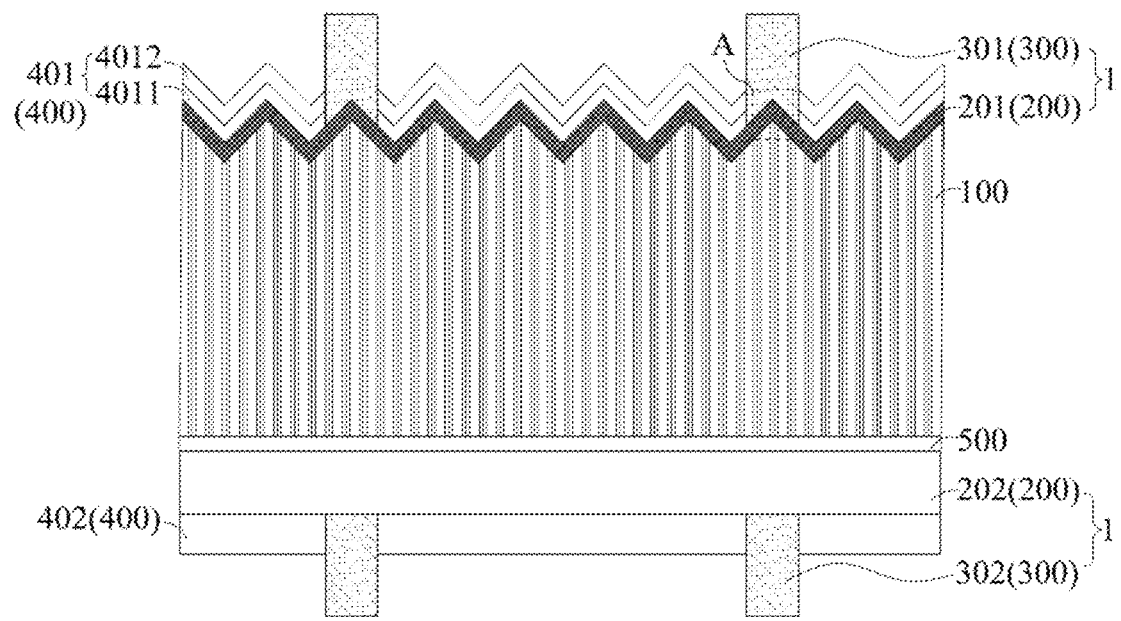
FIG. 1 is a schematic structural diagram of a first solar cell according to an embodiment of the present application.

100, Silicon substrate; 200, Doped silicon-based semiconductor layer; 201, First doped silicon-based semiconductor layer; 202, Second doped silicon-based semiconductor layer; 300, Metal electrode; 301, First metal electrode; 302, Second metal electrode; 400, Passivation layer; 401, First passivation layer; 4011, Alumina passivation layer; 4012, Anti-reflection layer; 402, Second passivation layer; 403, Third passivation layer; 500, Tunneling passivation layer; 601, First intrinsic amorphous silicon layer; 602, Second intrinsic amorphous silicon layer; 701, First transparent conductive layer; 702, Second transparent conductive layer; 800, Backside field passivation layer;

1, Metal-semiconductor contact structure; 11, First conductive region; 111, Pit island; 111a, Hole; 111b, Pit; 112, Silicon-based eutectic; 113, Conductive crystal; 1131, Crystalline main chain; 1132, Crystalline side chain; 12, Second conductive region; 121, Conductive aggregate; 1211, Glass phase material; 1212, Metal conductive particle.

DETAILED DESCRIPTION

The following clearly describes the technical solutions in embodiments of the present application with reference to the accompanying drawings in embodiments of this application. It is clear that the described embodiments are some but not all of embodiments of the present application. All other embodiments obtained by a person of ordinary skill in the art based on embodiments of the present application without creative efforts shall fall within the protection scope of this application.

In the present application, the orientation or positional relationship indicated by the terms "on", "under", "left", "right", "front", "back", "top", "bottom", "inside", "outside", "middle", "vertical", "horizontal", "transverse", "longitudinal" and the like is based on the orientation or positional relationship shown in the drawings. These terms are mainly intended to better describe the present application and its embodiments and are not intended to limit that the indicated devices, elements or constituents must have a particular orientation, or be constructed and operated in a particular orientation.

Also, in addition to being used to represent an orientation or positional relationship, some of the above terms may also be used to indicate other meanings. For example, the term "on" may also be used in some cases to denote a certain attachment or connection. The specific meanings of these terms in the present application may be understood by those ordinarily skilled in the art as the case may be.

In addition, the terms "installation", "setting", "being provided with", "connecting", "connected", "sleeving" should be understood broadly. For example, the connection may be a fixed connection, a detachable connection or an integrated construction, or may be a mechanical connection or an electrical connection, or may be a direct connection, or may be an indirect connection through an intermediary, or an internal communication between two devices, elements or constituents. The specific meanings of these terms in the present application may be understood by those ordinarily skilled in the art as the case may be.

In addition, the terms "first", "second", etc., are used primarily to distinguish different devices, elements or components (the specific type and construction may be the same or different) and are not used to indicate or imply the relative importance or quantity of the indicated device, element or component. Unless otherwise stated, "plurality" means two or more.

A metal-semiconductor contact structure is a structure formed by contacting a metal electrode with a semiconductor layer in a solar cell. Since carriers need to be transported through the metal-semiconductor contact structure, the performance of the metal-semiconductor contact structure has an important influence on performance indexes such as photoelectric conversion efficiency of the solar cell.

In the related art, the contact resistance between a metal electrode and a semiconductor layer of a solar cell is not ideal. Therefore, the present application provides a new metal semiconductor contact structure and a preparation method thereof, a solar cell, a solar cell string and a preparation method thereof, and a photovoltaic module, so as to further optimize the contact performance between the metal electrode and the semiconductor layer and reduce the contact resistance therebetween.

Since the metal-semiconductor contact structure of the embodiments of the present application is applied to a solar cell (especially to a crystalline silicon solar cell), the metal-semiconductor contact structure and the preparation method thereof will be introduced below when the solar cell of the embodiments of the present application is introduced, and the metal-semiconductor contact structure and the preparation method thereof will not be described separately.

In a first aspect, the embodiments of the present application provide a solar cell having a metal-semiconductor contact structure. Referring to FIG. 1, FIG. 1 is a schematic structural diagram of a first solar cell according to an embodiment of the present application, and the solar cell includes:

a silicon substrate 100;

a doped silicon-based semiconductor layer 200 and a passivation layer 400 sequentially provided on a surface of the silicon substrate 100;

a metal electrode 300 penetrating the passivation layer 400 and in physical contact with the doped silicon-based semiconductor layer 200.

That is, the metal electrode 300 and the doped silicon-based semiconductor layer 200 in physical contact form the metal-semiconductor contact structure 1, where the physical contact refers to a direct contact between a structure of the metal electrode 300 and a structure of the doped silicon-based semiconductor layer 200.

Here, the doped silicon-based semiconductor layer 200 may be provided on a light-receiving surface and/or a backlight surface of the silicon substrate 100, and correspondingly, the metal-semiconductor contact structure 1 may also be provided on the light-receiving surface and/or the backlight surface of the silicon substrate 100. As shown in FIG. 1, the doped silicon-based semiconductor layer 200 includes a first doped silicon-based semiconductor layer 201 provided on the light-receiving surface of the silicon substrate 100 and a second doped silicon-based semiconductor layer 202 provided on the backlight surface of the silicon substrate 100. The passivation layer 400 includes a first passivation layer 401 provided on a surface of the first doped silicon-based semiconductor layer 201 facing away from the silicon substrate 100, and a second passivation layer 402 provided on a surface of the second doped silicon-based semiconductor layer 202 facing away from the silicon substrate 100. The metal electrode 300 includes a first metal electrode 301 in contact with the first doped silicon-based semiconductor layer 201, and a second metal electrode 302 in contact with the second doped silicon-based semiconductor layer 202. The first doped silicon-based semiconductor layer 201 is in contact with the first metal electrode 301 to form the metal-semiconductor contact structure 1 located on the light-receiving surface of the silicon substrate 100. The second doped silicon-based semiconductor layer 202 is in contact with the second metal electrode 302 to form the metal-semiconductor contact structure 1 located on the backlight surface of the silicon substrate 100.

Taking the metal-semiconductor contact structure 1 located on the light-receiving surface of the silicon substrate 100 as an example, the metal-semiconductor contact structure 1 of the embodiments of the present application will be further described below.

Figure 2:
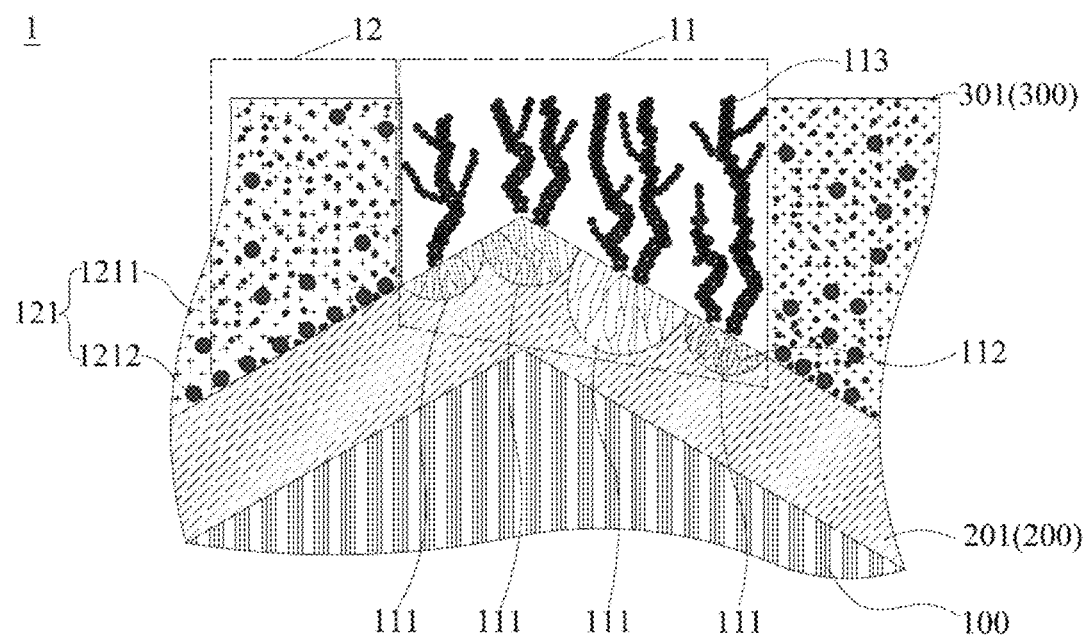
FIG. 2 is an enlarged schematic view of a structure at A in FIG. 1.
Figure 3:
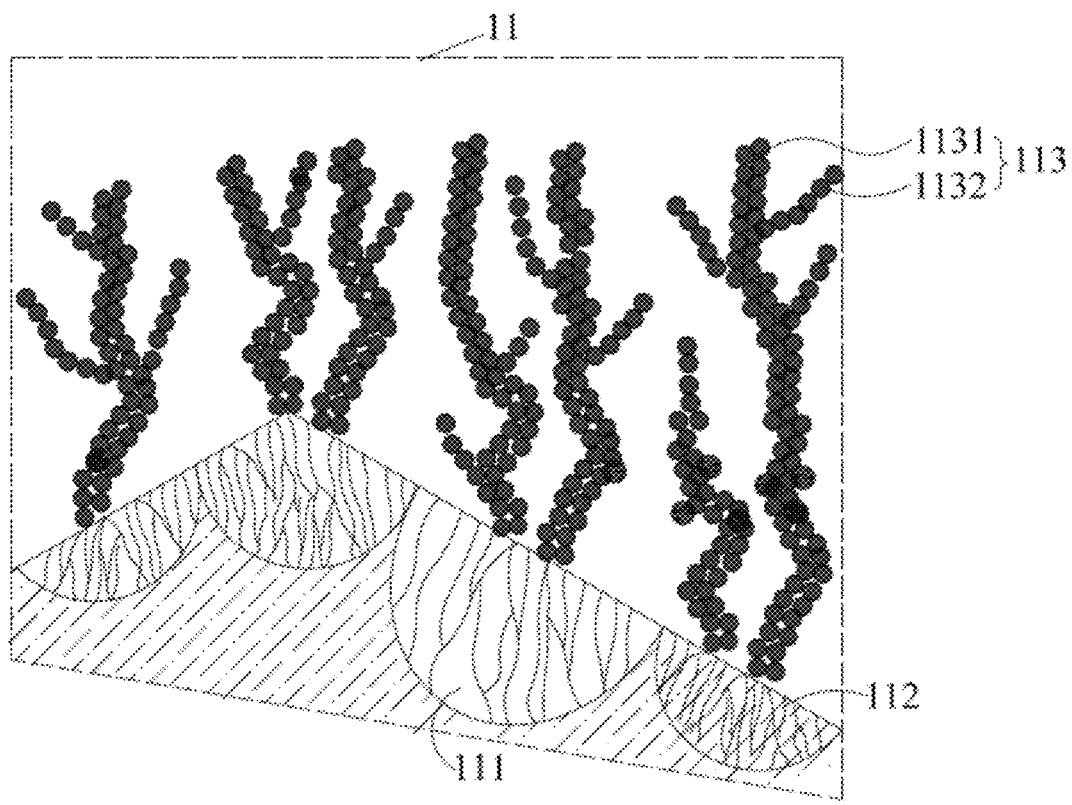
FIG. 3 is a schematic structural diagram of a first conductive region in a metal-semiconductor contact structure according to an embodiment of the present application.

Referring to FIG. 2 and FIG. 3, FIG. 2 is an enlarged schematic diagram of a structure at A in FIG. 1, and is also a schematic structural diagram of the metal-semiconductor contact structure 1 according to an embodiment of the present application, and FIG. 3 is a schematic structural diagram of a first conductive region in the metal-semiconductor contact structure according to an embodiment of the present application.

In the metal-semiconductor contact structure 1, the first doped silicon-based semiconductor layer 201 has a doping element therein, and the first metal electrode 301 has a metal element. Wherein a contact region is provided between the first doped silicon-based semiconductor layer 201 and the first metal electrode 301, and the contact region includes a first conductive region 11 and a second conductive region 12 located outside the first conductive region 11.

Figure 7:
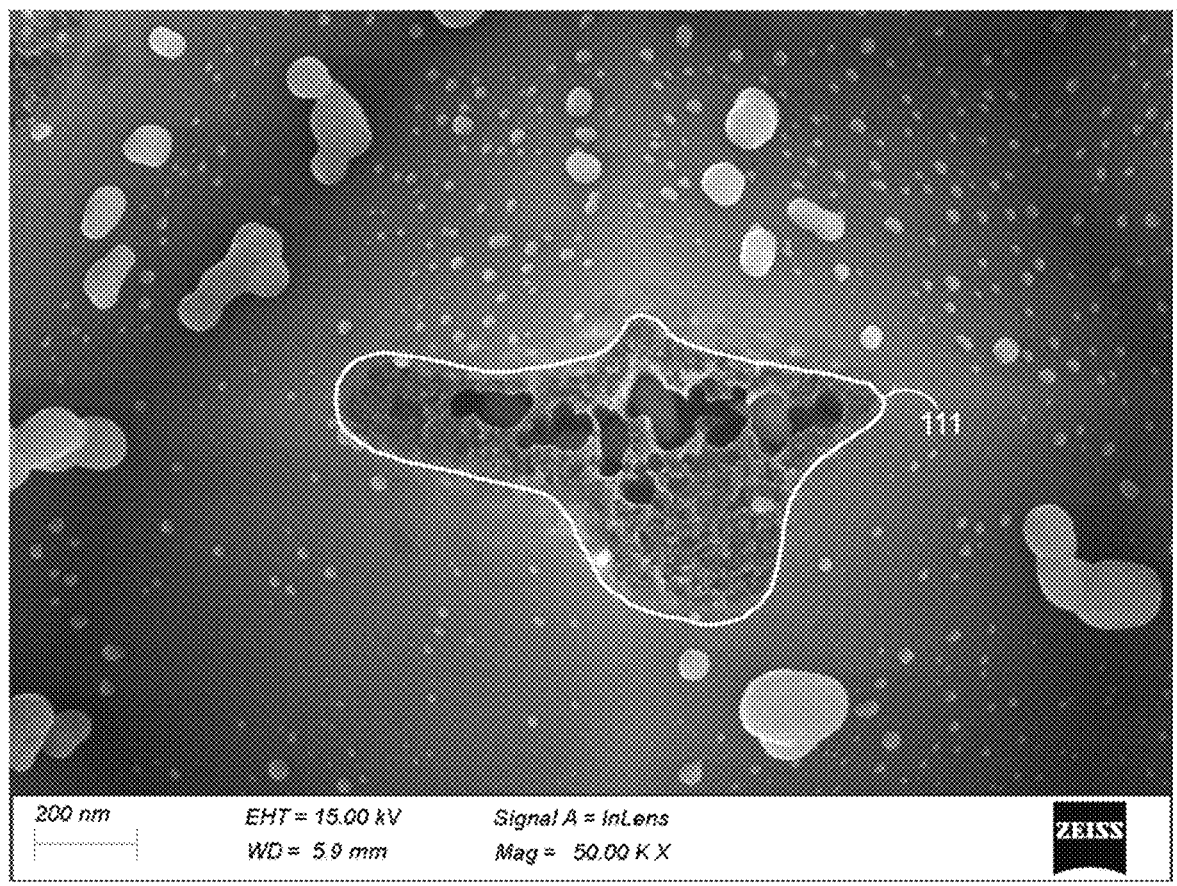
FIG. 7 is a SEM diagram at a contact interface of a metal-semiconductor contact structure in a solar cell according to Embodiment 1 of the present application.

In the first conductive region 11, the first metal electrode 301 in contact with the first doped silicon-based semiconductor layer 201 is recessed toward the first doped silicon-based semiconductor layer 201 (i.e. an upper surface of the first doped silicon-based semiconductor layer 201 is recessed downward in FIG. 2), and the pit island 111 shown in FIG. 7 is formed.

A silicon-based eutectic 112 is provided in the pit island 111. Specifically, several eutectics 112 are provided in at least part of the recesses of the recessed island 111, and these silicon-based eutectics 112 are in conductive contact with the first doped silicon-based semiconductor layer 201. A conductive crystal 113 in conductive connection with the silicon-based eutectic 112 is further provided in the first conductive region 11. The silicon-based eutectic 112 includes a eutectic formed by co-crystallization of a silicon element and a metal element. The conductive crystal 113 is formed extending from the silicon-based eutectic 112 towards the first metal electrode 301 (namely, the conductive crystal 113 is formed extending upwards from the silicon-based eutectic 112 in FIG. 2), and the conductive crystal 113 includes a crystal formed by crystallization of a metal element.

A conductive aggregate 121 is provided in the second conductive region 12, and the conductive aggregate includes a glass phase material 1211 and metal conductive particles 1212 distributed in the glass phase material 1211. The metal particles have a same kind of the metal element with the silicon-based eutectic 112 and the conductive crystal 113.

Compared with the metal-semiconductor contact structure of the related art, the metal-semiconductor contact structure 1 of the embodiment of the present application includes the conductive crystal 113 having a higher conductivity, and the silicon-based eutectic 112 for improving the conductivity of a semiconductor silicon material. So that the conductivity of a hole or electron output conductive structure of a solar cell is significantly increased, thereby the contact performance between the metal electrode 300 and the doped silicon-based semiconductor layer 200 is effectively improved by optimizing the conductive structure. It can be seen that by performing the above-mentioned improvement and optimization on the metal-semiconductor contact structure 1, the contact performance between the doped silicon-based semiconductor layer 200 and the metal electrode 300 can be improved, the contact resistance can be reduced, the carrier transport ability can be improved, and thus the open circuit voltage and photoelectric conversion efficiency of the solar cell can be effectively improved.

The silicon-based eutectic 112 and the conductive crystal 113 in conductive connection with the silicon-based eutectic 112 are provided in the first conductive region 11. Wherein the silicon-based eutectic crystal 112 exists in the doped silicon-based semiconductor layer 200 corresponding to the pit island 111, and the silicon-based eutectic crystal 112 includes a eutectic formed by a metal element and a silicon element, so that the silicon-based eutectic 112 is in conductive contact with the doped silicon-based semiconductor layer 200. The silicon-based eutectic 112 is doped with metal atoms having a relatively high electrical conductivity into the semiconductor silicon material, which can significantly increase the electrical conductivity of the semiconductor silicon material, i.e. the photo-generated carrier transport ability of the silicon-based eutectic 112 is greatly improved, and has the effect of reducing the contact resistance between the metal electrode 300 and the doped silicon-based semiconductor layer 200.

Meanwhile, a conductive crystal 113 is epitaxially formed from the silicon-based eutectic 112 toward the metal electrode 300, and the conductive crystal 113 includes a crystal formed by crystallization of the metal element, so that the conductive crystal 113 is in conductive contact with the silicon-based eutectic 112. Compared with a structure in which the metal conductive particles 1212 are in contact with the semiconductor material, the conductive crystal 113 formed after crystallization of the metal element has the characteristics of higher purity and higher conductivity, thereby reducing the series resistance of the solar cell and improving the photoelectric conversion efficiency.

It can be seen therefrom that in the first conductive region 11 of the embodiment of the present application, a first carrier transport path of photogenerated carriers in the contact region of the metal semiconductor contact structure 1 is formed by the conductive contact between the doped silicon-based semiconductor layer 200 and the silicon-based eutectic crystal 112 and the conductive contact between the silicon-based eutectic crystal 112 and the conductive crystal 113, that is, the silicon substrate 100, the doped silicon-based semiconductor layer 200, the silicon-based eutectic 112 and the conductive crystal 113.

Further, in the conductive aggregate 121, a portion of the metal conductive particles 1212 are located on a surface of the doped silicon-based semiconductor layer 200, the other portion of the metal conductive particles 1212 are distributed in the glass phase material 1211, and the conductive aggregate 121 is in conductive contact with the doped silicon-based semiconductor layer 200 through the metal conductive particles 1212.

It can be seen therefrom that in the second conductive region 12 of the embodiment of the present application, a second carrier transport path of photogenerated carriers in the contact region of the metal-semiconductor contact structure 1 is formed by the conductive contact between the doped silicon-based semiconductor layer 200 and the conductive aggregate 121, that is, the silicon substrate 100, the doped silicon-based semiconductor layer 200, and the conductive aggregate 121. Photogenerated carriers generated in the silicon substrate 100, after being transported into the doped silicon-based semiconductor layer 200, can also be transported through the metal conductive particles 1212 in direct contact with the doped silicon-based semiconductor layer 200, wherein the conductive aggregate 121 includes a glass phase material 1211 with a higher resistivity, so that the conductivity of the second carrier transport path is weaker than the conductivity of the first carrier transport path.

The pit island 111 is further described below.

As shown in FIG. 7, the pit island 111 includes a plurality of adjacent or communicating holes 111a, and a plurality of pits 111b with different depths extend on the periphery of the holes 111a, and the depth of the pits 111b is gradually shallow in a direction away from the holes 111a, forming a peripheral boundary of the pit island 111. When a boundary interval between two adjacent holes 111a in the pit island 111 does not exceed 200 nm, the adjacent holes 111a belong within one pit island 111, wherein the boundary interval between two adjacent holes 111a is defined as a shortest link distance between the boundaries of two adjacent holes 111a.

Further, a distribution density of the holes 111a is 1 to 50 per $\mu m^2$, and a hole diameter of the hole 111a is 10 nm to 100 nm.

Figure 8:
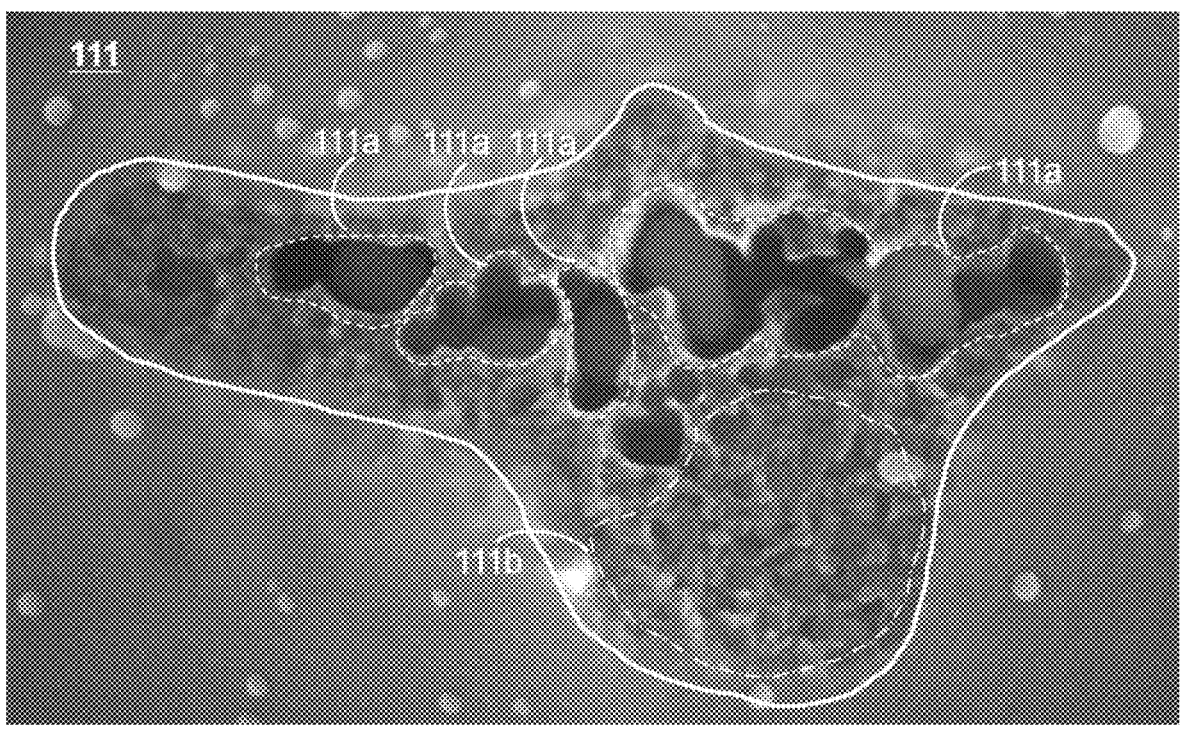
FIG. 8 is an enlarged schematic view of a pit island in FIG. 7.

The pit islands 111 are concentrated in a small area of the surface of the doped silicon-based semiconductor layer 200, and the surface of the area of the pit island 111 has a higher roughness than that of the second conductive region 12. The above-mentioned roughness can characterize an ablation degree of the passivation film layer corresponding to the doped silicon-based semiconductor layer 200, wherein a greater roughness indicates that the ablation degree of the passivation film layer is also greater. Taking the pit island 111 shown in FIG. 7 and FIG. 8 as an example, the roughness of the hole 111a in the middle is higher, which indicates that the ablation degree of the passivation film layer is greater, and even the doped silicon-based semiconductor layer is corroded more obviously. The pit 111b formed at the periphery of the hole 111a is also rougher than the surface of the second conductive region 12, and in particular, the surface of the doped silicon-based semiconductor layer also has a shallow degree of corrosion. The silicon-based eutectic 112 is present in the pit islands 111, so that the distribution of silicon-based eutectics 112 in the metal-semiconductor contact structure 1 is more abundant and denser. The silicon-based eutectic 112 and the conductive crystal 113 distributed in the pit island 111 contribute to further reduce the contact resistance between the metal electrode 300 and the doped silicon-based semiconductor layer 200.

Further, the surface of the doped silicon-based semiconductor layer 200 has a pyramid textured structure, and the pit island 111 is located at and/or near a tip of the pyramid textured structure, for example, near a tower side of the tip.

The metal electrode and the doped silicon-based semiconductor layer are further described below by way of example of the first metal electrode and the first doped silicon-based semiconductor layer.

Here, the fact that the first metal electrode 301 has a metal element means that a material corresponding to the metal element is used as a main component in the first metal electrode 301, and for example, when the first metal electrode 301 is a silver electrode, the main component in the first metal electrode 301 is a silver element. Preferably, the first metal electrode 300 is a silver electrode. More preferably, a content of a metallic aluminum impurity in the silver electrode is less than 0.1 wt %.

Wherein the first doped silicon-based semiconductor layer 201 has a doping element, which means that a main component of the first doped silicon-based semiconductor layer 201 is a silicon element, and a small amount of other doping elements are doped therein, so as to enhance the transport capability of the first doped silicon-based semiconductor layer 201 for electron carriers or hole carriers; for example, when the first doped silicon-based semiconductor layer 201 is a PN junction region, the main component in the first doped silicon-based semiconductor layer 201 is a silicon-based doped film layer having P-type doping or N-type doping. The PN junction region may be a diffused silicon layer formed by diffusing and doping a doping element different from that of the silicon substrate 100 into the silicon substrate 100, or a crystalline silicon layer doped with the doping element formed on the silicon substrate 100 by deposition (e.g. LPCVD deposition or PECVD deposition). Wherein the doping element includes an N-type doping element or a P-type doping element, the N-type doping element includes at least one of a phosphorus element, an antimony element or an arsenic element, and the P-type doping element includes at least one of a boron element, an indium element or a gallium element. Exemplarily, the doping element is, for example, a phosphorus element or a boron element, which means that a certain concentration of the doping element may be further doped when the main component is a silicon layer.

Note that a passivation layer is not included in a contact region between the first doped silicon-based semiconductor layer 201 corresponding to the pit island and the conductive crystal 113, and a passivation layer is included in a portion of a contact region between the first doped silicon-based semiconductor layer 201 corresponding to the second conductive region 12 and the conductive aggregate 121.

Alternatively, the first doped silicon-based semiconductor layer 201 is a doped silicon layer. Wherein the doped silicon layer includes at least one of a doped amorphous silicon layer, a doped polysilicon layer, a doped microcrystalline silicon layer or a doped crystalline silicon layer. When the first doped silicon-based semiconductor layer 201 includes a doped crystalline silicon layer, the doped crystalline silicon layer may be prepared by thermally diffusing a doping element on crystalline silicon. For example, in a passivated contact solar cell, the first doped silicon-based semiconductor layer 201 may be a doped silicon layer, such as a doped amorphous silicon layer or a PN junction region (the PN junction region may be a diffused silicon layer formed on the silicon substrate 100 by high temperature diffusion). For example, the silicon substrate 100 is an N-type silicon substrate 100, the first metal electrode 301 is a silver electrode, and the first doped silicon-based semiconductor layer 201 is a PN junction region formed by boron diffusing into the N-type silicon substrate 100. The above metal-semiconductor contact structure 1 is a contact structure formed by the silver electrode and the PN junction. In the conductive structure at the contact interface, the silicon-based eutectic 112 is a eutectic structure formed by the silver atoms and the silicon atoms, and the conductive crystal 113 is a crystal formed by crystallization of the silver atoms, that is, a silver elemental substance in a crystal form. The conductive aggregate 121 includes a glass phase material 1211 and silver conductive particles, and the silver conductive particles are silver nanoparticles.

The conductive crystal 113 is further described below.

Further, as shown in FIG. 3, in the metal-semiconductor contact structure 1 of the embodiment of the present application, the conductive crystal 113 includes a crystal main chain 1131 and a crystal side chain 1132 extending from the crystal main chain 1131 in a growth direction different from that of the crystal main chain 1131. In the embodiment of the present application, the crystal main chain 1131 and the side chain laterally grown from the crystal main chain 1131 make the conductive crystal 113 have a dendrite crystal structure as a whole.

In addition, a size of the conductive crystal is 1 nm to 30 nm.

The preparation method of the metal-semiconductor contact structure described above will be further described below.

The preparation method of the metal-semiconductor contact structure includes the following steps:

printing an electrode paste on the first doped silicon-based semiconductor layer; the electrode paste includes a glass phase material, metal particles, and an organic carrier;

pre-sintering the electrode paste at a high temperature, so that part of a surface of the first doped silicon-based semiconductor layer forms the pit island, and forming an electrode precursor on the first doped silicon-based semiconductor layer; wherein the electrode precursor includes the glass phase material and the metal conductive particles packaged in the glass phase material, and the sintering temperature is greater than or equal to a peak sintering temperature of the electrode paste;

performing laser-induced contact treatment on the electrode precursor to form the first metal electrode, and the first metal electrode and the first doped silicon-based semiconductor layer forming the metal-semiconductor contact structure.

Wherein, the peak sintering temperature of the electrode paste refers to a sintering temperature range in which a glass phase material in the electrode paste can ablate a passivation layer film and make the metal conductive particles in the electrode paste have a lower resistivity (less than 1.5 mΩ·cm) after the sintering treatment, and the sintering temperature range is usually defined as the peak sintering temperature of the electrode paste by those skilled in the art. Furthermore, at the peak sintering temperature, the organic carrier in the electrode paste has been substantially decomposed or volatilized, so that the electrode precursor formed after sintering mainly includes the glass phase material and the metal conductive particles packaged in the glass phase material.

On this basis, in the preparation method according to the embodiment of the present application, laser-induced contact treatment is further performed on the electrode precursor (a reverse bias voltage is applied in this process). On the one hand, the reverse bias voltage is used to further enhance a built-in electric field of the solar cell at the contact interface between the first doped silicon-based semiconductor layer and the electrode precursor. On the other hand, a large number of photogenerated carriers (i.e. electron-hole pairs) are generated by laser-induced contact treatment. Through the joint action of these two aspects, electron carriers and hole carriers are sorted by the electric field, and carriers of one charge electricity are rapidly transported to the first doped silicon-based semiconductor layer under the acceleration of the electric field (for example, when the first doped silicon-based semiconductor layer has a textured structure of a pyramid shape, the carriers are more easily transported to the tip and a position near the tip). These carriers generate a large amount of heat when passing through the glass phase material having a high resistivity. Since carriers are transported along a path of maximum conductivity, and the passivation layer at and near the tip of the pyramid is more likely to be bombarded by deposition atoms during the formation of the passivation layer, the passivation layer at and near the tip of the pyramid is thinner and has a higher conductivity that facilitates carrier transport than at non-tip positions in the pyramid structure. Thus pit islands are typically present at and near the tip in an area covered by electrode grid lines of the solar cell plate.

In summary, it can be seen that in the preparation method of a metal semiconductor contact structure in the embodiments of the present application, by pre-sintering a specific electrode paste at a high-temperature in combination with a laser-induced contact treatment, a metal-semiconductor contact structure having the above-mentioned structural features can be formed without causing large-area corrosion on the passivation layer covered on the surface of the doped silicon-based semiconductor layer. Thus the metal-semiconductor contact structure has an excellent surface passivation effect.

Further, in the step of pre-sintering the electrode paste at a high temperature, a temperature of sintering at a high (peak) temperature is 700° C. to 850° C. Compared to the pre-sintering operation at a high temperature in the related art, the embodiments of the present application do not cause large-area corrosion to the surface of the doped silicon-based semiconductor layer despite using this high-temperature pre-sintering condition.

Further, in the step of performing the laser-induced contact treatment on the electrode precursor, an voltage of the applied reverse bias voltage is 9V to 15 V. The heat generated by the carriers generated by the laser-induced contact treatment when passing through the contact interface between the first doped silicon-based semiconductor layer and the electrode precursor is closely related to the aforementioned range of the reverse bias voltage. When the reverse bias voltage is within the aforementioned range, it is conducive to generating a higher heat of 1500K to 8000K as the carriers pass through the contact interface, and this higher heat is used to decompose the glass phase material at a corresponding position, so as to promote the appropriate enlargement of the pit island and provide a space for further growth of more silicon-based eutectics. At the same time, the region where the metal electrode located in the pit island is located may also generate pits due to the decomposition of the glass phase material and provide a space for the growth of the conductive crystal. Under the aforementioned reverse bias voltage conditions, all of the glass phase material in the region of the pit may decompose or most of it may decompose. When the reverse bias voltage is at a lower voltage value within the aforementioned range, most of the glass phase material in the pit may decompose, with a small portion remaining. Since conductive crystals will still grow in the pit and a volume ratio of the glass phase material is reduced, the carrier transport capability of the first conductive region may still be enhanced by a combination effect of the pit and the conductive structure. For example, the voltage of the reverse bias voltage is 9 V, 10 V, 11 V, 12 V, 13 V, 14 V, or 15 V Further, in the step of performing the laser-induced contact treatment, an voltage of the applied reverse bias voltage is 11 V. Under the preferred reverse bias voltage conditions mentioned above, high temperatures of 1000K to 8000K can be generated at the contact interface. This instantaneous high temperature not only causes the glass phase material to decompose, leaving only the conductive crystal or mostly conductive crystal in the pit, but also melt the metal conductive particles at the contact interface. Thus the semiconductor atoms in the molten state inter-melt and diffuse with the metal atoms to form a semiconductor silicon layer doped with the metal atoms, so as to improve the carrier transport ability of the silicon-based eutectic.

Further, in the step of applying a reverse bias voltage to the electrode precursor and performing the laser-induced contact treatment, conditions of the laser-induced contact treatment include a single wavelength spectrum having a wavelength of 500 nm to 1200 nm, a current density of 1000 A/cm$^2$ to 1400 A/cm$^2$, and a scanning rate of 35 m/s to 55 m/s.

For the aforementioned laser-induced contact treatment conditions, a laser of a single wavelength is used to excite photogenerated carriers in the first doped silicon-based semiconductor layer 201. Exemplarily, the wavelength of an injected laser light in the process of the laser-induced contact treatment is 532 nm, 635 nm, 650 nm, 808 nm, 980 nm, or 1064 nm. When the semiconductor element of the first doped silicon-based semiconductor layer 201 is silicon and a laser is used for laser-induced contact treatment, it is preferable to use a laser with a wavelength of 1064 nm or 808 nm.

Preferably, the preparation method of the metal-semiconductor contact structure further includes a step of light injection:

In one implementation, light injection is performed after the step of sintering the electrode paste at a high temperature and before the step of performing laser-induced contact treatment on the electrode precursor. In another implementation, the light injection is performed after the step of performing laser-induced contact treatment on the electrode precursor.

The light injection process mainly improves a passivation performance. Process steps of light injection annealing furnace: A first step of increasing the temperature, activating H atoms in the silicon nitride passivation film by increasing the temperature; a second step, controlling a valence state of the H atoms by illumination so that they combine with recombination centers (defects) at the P+ emitter and the N-type substrate to form non-recombination centers. Finally, a good passivation effect is achieved, and the open circuit voltage and fill factor are improved.

In addition, compared with a method of performing the light injection after the step of performing the laser-induced contact treatment, the method of firstly pre-sintering the electrode paste at a high temperature, then performing light injection, and then performing the laser-induced contact treatment on the electrode precursor is more advantageous to optimize the performance of the solar cell. This is because the operation of light injection also has a certain amount of heat, and when light injection is performed before performing laser-induced contact treatment on the electrode precursor, it is possible to passivate grain boundaries and defect states.

Further, the light injection process adjusts the Fermi level change by temperature and light intensity to control a total amount of hydrogen and valence state to improve the passivation performance. The step of light injection includes: primarily heating of the electrode precursor, wherein a peak temperature of the primary heating is between 200° C. to 600° C.; secondary heating of the electrode precursor and illumination, wherein a peak temperature of the secondary heating is 100° C. to 300° C., an energy density of the illumination is 10 kW/m$^2$ to 100 kW/m$^2$, and the wavelength of the illumination is a continuous spectral band of 500 nm to 1200 nm. By controlling the heating conditions and the illumination conditions in the above-mentioned range in the light injection step, not only a good passivation effect may be achieved, but also the glass phase material corroding the first doped silicon-based semiconductor layer due to an excessively high heating temperature may be prevented. Note that in the light injection step of the embodiment of the present application, a continuous spectral band having a wavelength of 500 nm to 1200 nm is injected, which is different from the single-wavelength laser used in the step of laser-induced contact treatment.

Other structural film layers of the solar cell of the embodiment of the present application are further described below.

Referring back to FIG. 1, in the solar cell of the embodiment of the present application, the silicon substrate 100 has an N-type conductivity or a P-type conductivity, for example, the silicon substrate 100 is an N-type silicon wafer. A light-receiving surface of the silicon substrate 100 has a textured structure such as a pyramid-shaped textured structure. By providing the textured structure, it is advantageous to reduce the reflectivity of the surface of the silicon substrate 100 and increase the refraction and scattering of light inside the silicon substrate 100.

On the light-receiving surface of the silicon substrate 100, the first doped silicon-based semiconductor layer 201 may be a diffusion layer formed by diffusing and doping an N-type doping element or a P-type doping element into the silicon substrate 100, or may be a doped polysilicon layer or a doped amorphous silicon layer formed on the light-receiving surface of the silicon substrate 100 by deposition. For example, the first doped silicon-based semiconductor layer 201 of the silicon substrate may be a boron diffusion layer, so that a PN junction is formed between the N-type silicon wafer and the first doped silicon-based semiconductor layer 201, and when the silicon substrate 100 has a textured structure, it means that the surface of the first doped silicon-based semiconductor layer 201 also has the same textured structure.

A first passivation layer 401 is further provided on a side of the first doped silicon-based semiconductor layer 201 facing away from the silicon substrate 100. The first passivation layer 401 includes a composite layer of one or more of an aluminum oxide layer, a silicon oxide layer, a silicon nitride layer, and a silicon oxynitride layer. In the solar cell shown in FIG. 1, the first passivation layer 401 includes an alumina passivation layer 4011 disposed close to the first doped silicon-based semiconductor layer 201 and an anti-reflection layer 4012 having an anti-reflection function disposed away from the first doped silicon-based semiconductor layer 201. The first metal electrode 301 is in contact with the first doped silicon-based semiconductor layer 201 after penetrating the anti-reflection layer 4012 and the aluminum oxide passivation layer 4011 in sequence.

Structural film layers of the light-receiving surface of the solar cell is described above. It will be appreciated that, depending on structural characteristics of different types of solar cells, layers of other structural characteristics may also be provided on the light-receiving surface and the backlight surface of the solar cell. The aforementioned metal-semiconductor contact structure 1 can also be used, for example, when the film layer of the backlight surface has the second metal electrode 302 and the second doped silicon-based semiconductor layer 202 in contact with each other. In addition, the method of forming the structural film layer may also employ conventional practices of the prior art. For example, a silicon substrate 100 having a textured structure is obtained by texturing, a first doped silicon-based semiconductor layer 201 having a PN junction is obtained by doping a doping element by means of thermal diffusion doping, and a first passivation layer 401 is obtained by an ALD or PECVD process, etc. In addition, the embodiments of the present application can also use conventional practices such as polishing and cleaning according to the formation of a coating layer, a borosilicate glass layer or a phosphosilicate glass layer during the formation of each structural film layer, and this is not limited in the present application.

Taking an TOPCON solar cell shown in FIG. 1 as an example, in a direction away from the silicon substrate 100, a tunneling passivation layer 500, a second doped silicon-based semiconductor layer 202, a second passivation layer 402 and a patterned second metal electrode 302 are successively provided on the backlight surface of the silicon substrate 100, and the second metal electrode 302 penetrates the second passivation layer 402 and then contacts the second doped silicon-based semiconductor layer 202.

A material of the tunneling passivation layer 500 may include a plurality of dielectric materials, such as at least one of silicon oxide, amorphous silicon, polysilicon, and silicon carbide. Specifically, the tunneling passivation layer 500 may be composed of a silicon oxide layer containing silicon oxide. This is because the silicon oxide layer has excellent passivation properties, can minimize recombination loss of minority carriers at the surface of the semiconductor substrate, and is a thin film having excellent durability to a subsequent high-temperature process. The tunneling passivation layer 500 may also function as a pinhole channel to allow carriers within the solar cell to move freely. Selective passage of majority carriers through heavily doped polysilicon may be beneficial in reducing recombination loss of minority carriers. The second doped silicon-based semiconductor layer 202 is a phosphorus-doped polysilicon layer, and the second passivation layer 402 is a passivation layer, and the material thereof can be any one material or any combination of materials selected from silicon oxide, aluminium oxide, silicon carbide, silicon nitride or silicon oxynitride layers.

Figure 4:
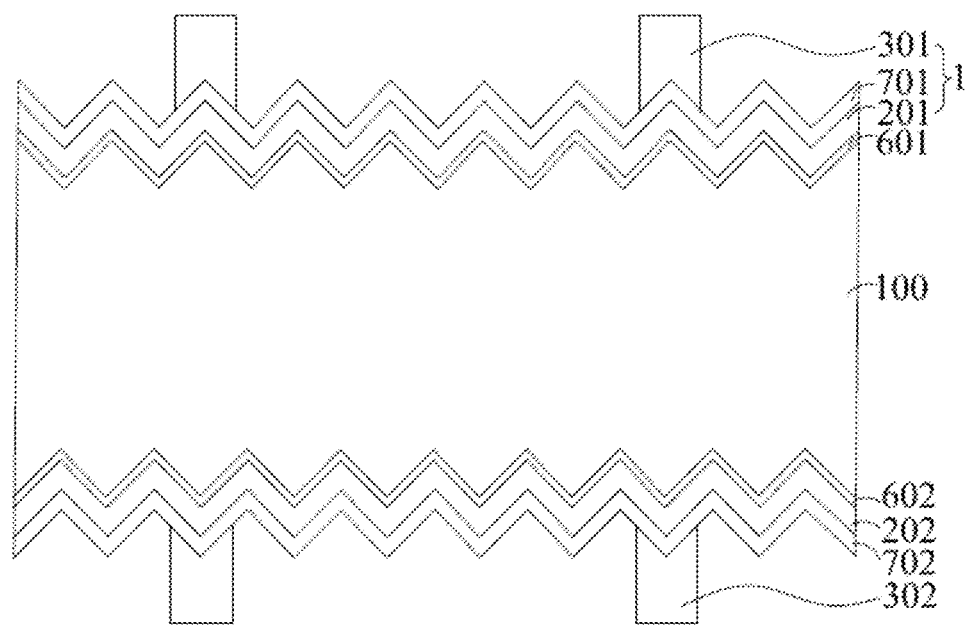
FIG. 4 is a schematic structural diagram of a second solar cell according to an embodiment of the present application.

Referring to FIG. 4, FIG. 4 is a schematic structural diagram of a second solar cell according to an embodiment of the present application, the solar cell is an HJT solar cell and the solar cell includes:

a silicon substrate 100;

a first intrinsic amorphous silicon layer 601, a first doped silicon-based semiconductor layer 201, and a first transparent conductive layer 701 sequentially provided on a light-receiving surface of the silicon substrate 100;

a first metal electrode 301, and the first metal electrode 301, the first doped silicon-based semiconductor layer 201 and the first transparent conductive layer 701 form a metal-semiconductor contact structure 1.

The silicon substrate 100 has an N-type conductivity or a P-type conductivity, for example, the silicon substrate 100 is an N-type crystalline silicon layer. The light-receiving surface of the silicon substrate 100 has a textured structure such as a pyramid-shaped textured structure. The first intrinsic amorphous silicon layer 601 is one or more stacked intrinsic amorphous silicon layers and/or hydrogenated amorphous silicon layers. The first doped silicon-based semiconductor layer 201 is an N-type doped silicon layer or a P-type doped silicon layer; the doped silicon layer can be one layer or multiple layers; and the doped silicon layer can be a doped amorphous silicon layer or a doped microcrystalline silicon layer. The first transparent conductive layer 701 is one or more of an indium tin oxide layer, an aluminum-doped zinc oxide layer, a zinc oxide layer, an indium oxide layer, and a tin oxide layer.

In an alternative implementation, the silicon substrate 100 is an N-type crystalline silicon layer, the first doped silicon-based semiconductor layer 201 is a P-type doped microcrystalline silicon layer or an N-type doped microcrystalline silicon layer, the first transparent conductive layer 701 is an indium tin oxide layer, and the first metal electrode 301 is a silver electrode.

During the preparation of the metal-semiconductor contact structure 1, the laser-induced contact treatment instantaneously generate local heat concentration points, and a large amount of heat instantaneously melts metal silver particles in the doped microcrystalline silicon layer, the first transparent conductive layer 701 and the electrode paste, so that part of the silver atoms successively diffuse into the first transparent conductive layer 701 and the P-doped microcrystalline silicon thin film, and forms the metal-semiconductor contact structure 1 composed of doped silicon, indium tin oxide and silver atoms in a subsequent cooling process.

It will be appreciated that the backlight surface of the silicon substrate 100 may have structural film layers symmetrical to the light-receiving surface, i.e: a second intrinsic amorphous silicon layer 602, a second doped silicon-based semiconductor layer 202 and a second transparent conductive layer 702 are successively provided on the backlight surface of the silicon substrate 100, and a second metal electrode 302 is formed on the backlight surface, and the second metal electrode 302, the second doped silicon-based semiconductor layer 202 and the second transparent conductive layer 702 form a metal-semiconductor contact structure 1.

Figure 5:
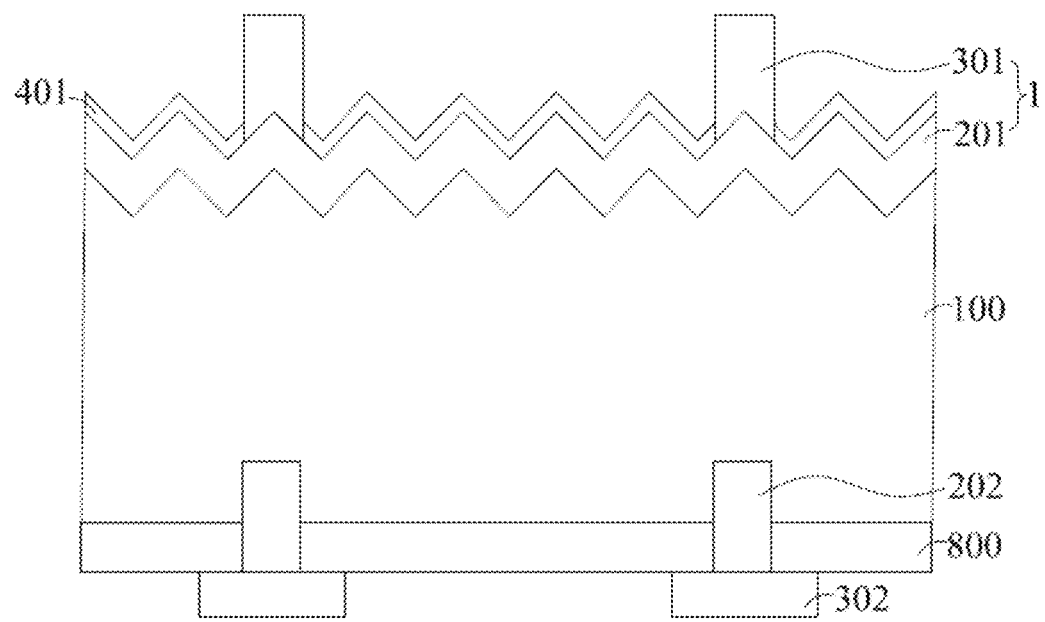
FIG. 5 is a schematic structural diagram of a third solar cell according to an embodiment of the present application.

Referring to FIG. 5, FIG. 5 is a schematic structural diagram of a third solar cell according to an embodiment of the present application, the solar cell is a PERC solar cell and the solar cell includes:

a silicon substrate 100;

a first doped silicon-based semiconductor layer 201 and a first passivation layer 401 sequentially formed on a light-receiving surface of the silicon substrate 100;

a first metal electrode 301 penetrating the first passivation layer 401 to form an ohmic contact with the first doped silicon-based semiconductor layer 201;

and the first metal electrode 301 and the first doped silicon-based semiconductor layer 201 form a metal-semiconductor contact structure 1.

The silicon substrate 100 has an N-type conductivity or a P-type conductivity, for example, the silicon substrate 100 is a P-type silicon substrate 100. The light-receiving surface of the silicon substrate 100 has a textured structure such as a pyramid-shaped textured structure. By providing the textured structure, it is advantageous to reduce the reflectivity of the surface of the silicon substrate 100 and increase the refraction and scattering of light inside the silicon substrate 100. The first doped silicon-based semiconductor layer 201 is an N-type doped silicon layer or a P-type doped silicon layer; the doped silicon layer can be one layer or multiple layers. In an alternative implementation, the silicon substrate 100 is a P-type crystalline silicon layer, the first doped silicon-based semiconductor layer 201 is an N-type doped crystalline silicon layer, and the metal electrode 301 is a silver electrode.

It will be appreciated that the backlight surface of the silicon substrate 100 may have other structural layers corresponding to structural features of the PERC cell. For example, a back surface field passivation layer 800 with negative charge electricity is provided on the backlight surface of the silicon substrate 100. The second metal electrode 302 on the backlight surface is located on the side of the back surface field passivation layer 800 that is away from the silicon substrate 100, and the second metal electrode 302 is ohmically contacted with the second doped silicon-based semiconductor layer 202.

Figure 6:
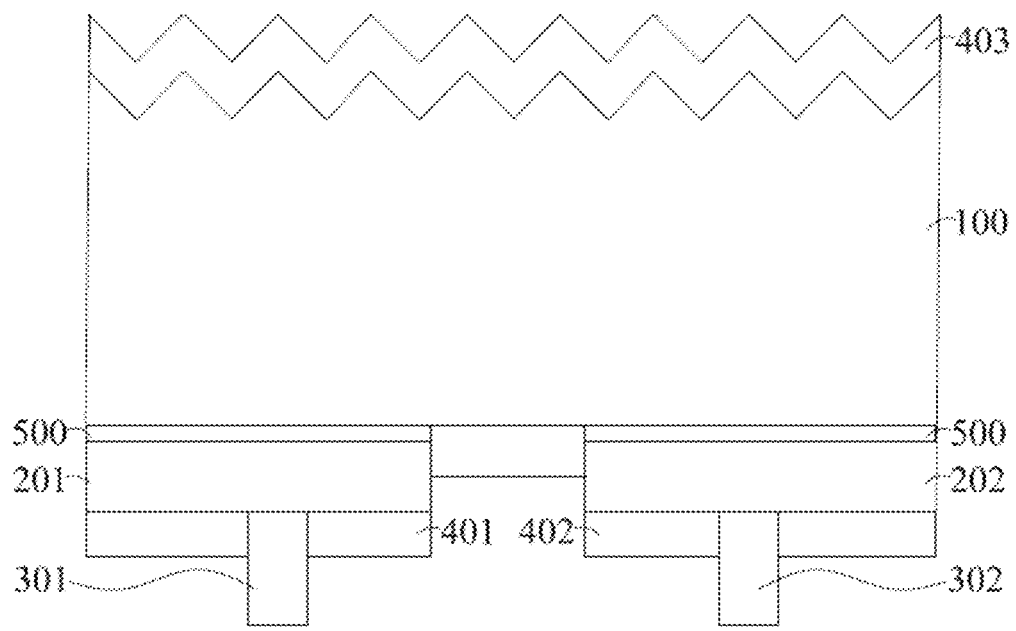
FIG. 6 is a schematic structural diagram of a fourth solar cell according to an embodiment of the present application.

Referring to FIG. 6, FIG. 6 is a schematic structural diagram of a fourth solar cell according to an embodiment of the present application, the solar cell is an IBC solar cell and the solar cell includes:

a silicon substrate 100;

a tunneling passivation layer 500, a first doped silicon-based semiconductor layer 201 and a first passivation layer 401 which are successively provided in an N-type conductive region of a backlight surface of the silicon substrate 100, and a tunneling passivation layer 500, a second doped silicon-based semiconductor layer 202 and a second passivation layer 402 which are successively provided in a P-type conductive region of the backlight surface of the silicon substrate 100, wherein the first doped silicon-based semiconductor layer 201 has an N-type doping element, and the second doped silicon-based semiconductor layer 202 has a P-type doping element;

a first metal electrode 301 penetrating the first passivation layer 401 of the N-type conductive region and ohmically contacted with the first doped silicon-based semiconductor layer 201, so that the first metal electrode 301 and the first doped silicon-based semiconductor layer 201 form a first metal-semiconductor contact structure 1;

a second metal electrode 302 penetrating the second passivation layer 402 of the P-type conductive region and ohmically contacted with the second doped silicon-based semiconductor layer 202, so that the second metal electrode 302 and the second doped silicon-based semiconductor layer 202 form a second metal-semiconductor contact structure 1.

The silicon substrate 100 has an N-type conductivity or a P-type conductivity, for example, the silicon substrate 100 is an N-type silicon substrate 100. A light-receiving surface of the silicon substrate 100 has a textured structure such as a pyramid-shaped textured structure. By providing the textured structure, it is advantageous to reduce the reflectivity of the surface of the silicon substrate 100 and increase a light trapping effect of light inside the silicon substrate 100. In addition, other structural film layers may be provided on the light-receiving surface of the silicon substrate 100 according to actual needs. For example, a third passivation layer 403 is provided on the light-receiving surface of the silicon substrate 100.

The embodiments of the present application further provides a fifth solar cell (not shown in the FIGS.), which is a perovskite-crystalline silicon laminated solar cell, wherein the perovskite cell serves as a top cell, any one of the above-mentioned first solar cell to fourth solar cell serves as a bottom cell, and only needs to provide the metal-semiconductor contact structure composed of the first conductive region having the conductive crystal and the conductive eutectic, and the second conductive region having the conductive aggregate on a backlight surface of a crystalline silicon bottom cell.

In second aspect, the present application provides a preparation method of a solar cell string including the steps of:
welding a plurality of the solar cells according to the second aspect to form a cell string precursor;
performing the laser-induced contact treatment on the cell string precursor to obtain the solar cell string.

In the present application, when the solar cells having the above-mentioned metal-semiconductor contact structure are welded, it is found that the performance degradation of several solar cells of the embodiments of the present application after being welded is more obvious. It is found that the conductive structures such as silicon-based eutectic and conductive crystal in the metal-semiconductor contact structure, which promote the improvement of contact performance, are more likely to fracture and melt during the welding process of the solar cell string, thereby reducing the conductivity of the solar cell. Therefore, in the present application, after the solar cell string is welded, by an operation of performing the laser-induced contact treatment on the formed cell string precursor again, the broken fused silicon-based eutectic and conductive crystal are repaired, the carrier transport path is restored, the contact performance of the metal-semiconductor contact structure is ensured to be good, and the problem of photoelectric conversion efficiency attenuation caused by the link of the solar cell being welded into the solar cell string is alleviated.

Further, in the step of performing laser-induced contact treatment on the cell string precursor,
a voltage of the reverse bias voltage is 10 V to 50 V; and/or,
a wavelength of the laser is 500 nm to 1200 nm; and/or,
an energy density of the laser is 10 kW/m² to 10000 kW/m²; and/or,
a scanning rate of the laser is between 26 m/s to 65 m/s.

In a third aspect, the embodiments of the present application provides a solar cell string prepared by the preparation method according to the second aspect.

In a fourth aspect, the present application provides a photovoltaic module including the solar cell according the first aspect. The photovoltaic module is formed by connecting several of the above solar cells in series and/or in parallel and packaging.

The present application will be further described below with reference to more specific examples. In addition, the sodium hydroxide and TS40 additives, the electrode paste, etc. used in the following embodiments are commercially available, for example, a commercially available silver electrode paste of DK-93T type is used as the electrode paste, and the electrode paste has an Al content of 0.05 wt % to 0.10 wt % and an oxygen content of 1.0 wt % to 5.0 wt %. The elemental content ratio in the silver electrode paste can be measured by EDS (Energy Dispersive Spectrometer).

Embodiment 1

This embodiment provides a solar cell having a metal-semiconductor contact structure, and the preparation therefor is as follows:
(1) Texturing: in a tank device, sodium hydroxide with a volume ratio of 7:1 and an additive of type TS40 were used, the temperature was maintained at 80° C. for 7 min, rapid texturing was performed on a silicon substrate, and a thinning amount was controlled at 5 μm of the silicon substrate;
(2) Boron diffusion: the textured silicon substrate was placed into a boron diffusion furnace and $BCl_3$ was introduced at a temperature of 850° C. to 1050° C. for boron diffusion to form a boron diffusion layer;
(3) Alkaline etching: a chain-type HF device was used to remove the boron silicon glass on the backlight surface of the silicon substrate caused by boron diffusion, and then a tank-type alkaline etching machine was used to remove a P-N junction on the backlight surface and edges of the silicon substrate.
(4) Preparation of a tunneling passivation layer: a silicon oxide tunneling passivation layer was deposited on the backlight surface of the silicon substrate using a tube-type PECVD equipment.
(5) Preparation of a phosphorus-doped amorphous silicon Layer: a phosphorus-doped polycrystalline silicon layer was deposited on the tunneling passivation layer using a tube-type PECVD equipment.
(6) Annealing: a tube-type annealing furnace was used for performing annealing.
(7) RCA cleaning: firstly, the phosphorus-doped polycrystalline silicon layer and its mask layer that have been plated onto the light-receiving surface was removed by using hydrofluoric acid with a mass concentration of 5% while passing through a chain-type device, then the plated layer on the light-receiving surface was removed after transfered to a tank-type alkaline etching machine.
(8) Deposition of a passivation layer: an ALD device was used to deposit an aluminum oxide layer on the boron diffusion layer as the first passivation layer, then a PECVD device was used to deposit a silicon nitride oxide layer on the aluminum oxide layer as an anti-reflection layer; a PECVD device was used to deposit a silicon nitride oxide layer on the phosphorus-doped polycrystalline silicon layer as the second passivation layer; wherein the first passivation layer, the anti-reflection layer and the second passivation layer can all be understood as a passivation layer provided on the doped silicon-based semiconductor layer;

(9) Fabrication of metal-semiconductor contact structures:

(9.1) the electrode paste was screen-printed on the anti-reflection layer and the second passivation layer, respectively;

(9.2) Pre-sintering electrode paste at a high temperature: the electrode paste was pre-sintered at a high temperature of 800° C. to form an electrode precursor;

(9.3) Light injection: the electrode precursor was heated at a peak temperature of a primarily heating of 500° C., the electrode precursor was heated at a peak temperature of the secondary heating of 200° C., and light injection was performed using a continuous spectral band with a wavelength of 500 nm to 1200 nm under an energy density of light of 50 kW/m$^2$;

(9.4) Applying a reverse bias voltage to the electrode precursor and performing laser-induced contact treatment after the light injection, a reverse bias voltage was applied to the electrode precursor and a laser-induced contact treatment was performed, so that the electrode precursor located on the light-receiving surface and/or the backlight surface was converted into a first metal electrode and a second metal electrode, and the first metal electrode was in contact with the boron diffusion layer after penetrating the anti-reflection layer and the first passivation layer to form a first metal-semiconductor contact structure, and the second metal electrode was in contact with the phosphorus-doped polycrystalline silicon layer after penetrating the second passivation layer to form a second metal-semiconductor contact structure; wherein the reverse bias voltage is 15V, and the laser-induced contact treatment conditions include a laser wavelength of 1064 nm, a current density of 1200 A/cm$^2$ and a scan rate of 40 m/s.

A scanning electron microscope was taken of the metal-semiconductor contact structure in the solar cell of this example to obtain a SEM diagram as shown in FIG. 7.

Embodiment 2

This embodiment differs from Embodiment 1 in that: in the step of Fabrication of metal-semiconductor contact structures, after pre-sintering the electrode paste at a high temperature, firstly a laser-induced contact treatment was performed, then light injection was performed.

Embodiment 3

This embodiment differs from Embodiment 1 in that: in the step of Fabrication of metal-semiconductor contact structures, light injection was not performed.

Embodiment 4

This embodiment provides a solar cell string, and the preparation therefor includes the following steps:
six solar cells of Embodiment 1 were welded to form a cell string precursor;
the laser-induced contact treatment was performed on the cell string precursor to obtain the solar cell string; wherein the reverse bias voltage is 50V, and the laser-induced contact treatment conditions include a laser wavelength of 1064 nm, a current density of 5000 kW/m$^2$ and a scan rate of 50 m/s.

DESCRIPTION OF PERFORMANCE TESTING

Scanning Electron Microscope (SEM) Testing:

By means of chemical etching, firstly, nitric acid was used to etch away the bulk silver of the metal electrode at an outermost layer of the solar cell, so as to expose the glass phase material component used for ablating through the passivation layer, and then hydrofluoric acid was used to etch away the glass phase material component layer, so as to expose the pit islands located at the contact interface of the metal-semiconductor contact structure, which is photographed by a scanning electron microscope, and a corresponding SEM diagram was obtained.

The technical solutions disclosed in the embodiments of the present application are described in detail above. Specific examples are used herein to illustrate the principle and implementations of the present application. The descriptions of the above embodiments are only used to help understand the technical solution of the present application and core ideas thereof. Moreover, for those of ordinary skill in the art, according to the ideas of the present disclosure, there will be changes in the specific implementations and the scope of application. In summary, the content of this specification should not be construed as limiting the present disclosure.

What is claimed is:

1. A metal-semiconductor contact structure comprising:
a doped silicon-based semiconductor layer;
and a metal electrode, wherein the metal electrode and the doped silicon-based semiconductor layer are in contact with each other, and the metal electrode has a metal element;
wherein, a contact region is provided between the doped silicon-based semiconductor layer and the metal electrode, and the contact region comprises a first conductive region and a second conductive region located outside the first conductive region;
in the first conductive region, the metal electrode is recessed towards an inner direction of the doped silicon-based semiconductor layer to form a pit island, a silicon-based eutectic is provided in the pit island, the silicon-based eutectic is in conductive connection with the doped silicon-based semiconductor layer, and a conductive crystal in conductive connection with the silicon-based eutectic is further provided in the first conductive region, and the silicon-based eutectic comprises a eutectic formed by co-crystallization of a silicon element and the metal element;
a conductive aggregate is provided in the second conductive region, the conductive aggregate comprises a glass phase material and metal conductive particles, and the metal conductive particles have a same kind of the metal element as the conductive crystal.

2. The metal-semiconductor contact structure according to claim 1, wherein, a portion of the metal conductive particles are located on a surface of the doped silicon-based semiconductor layer, another portion of the metal conductive particles are distributed in the glass phase material, and the conductive aggregate is in contact with the doped silicon-based semiconductor layer through the metal conductive particles.

3. The metal-semiconductor contact structure according to claim 1, wherein, the pit island comprises a number of holes and pits located at the periphery of the holes.

4. The metal-semiconductor contact structure according to claim 3, wherein, a distribution density of the holes is $1/\mu m^2$ to $50/\mu m^2$; and/or,
a hole diameter of the holes is 10 nm to 100 nm.

5. The metal-semiconductor contact structure according to claim 1, wherein, a surface of an area of the pit island has a higher roughness than the second conductive region; and/or,
a surface of the doped silicon-based semiconductor layer has a pyramid textured structure, and the pit island is located at or near a tip of the pyramid textured structure.

6. The metal-semiconductor contact structure according to claim 1, wherein, a metal material of the metal electrode comprises a silver material; and/or,
the doped silicon-based semiconductor layer comprises one of a doped amorphous silicon layer, a doped polysilicon layer, a doped microcrystalline silicon layer or a doped crystalline silicon layer.

7. The metal-semiconductor contact structure according to claim 1, wherein, the conductive crystal comprises a crystalline main chain and a crystalline side chain extending from the crystalline main chain toward a direction different from a growth direction of the crystalline main chain.

8. The metal-semiconductor contact structure according to claim 1, wherein, a size of the conductive crystal is 1 nm to 30 nm.

9. A preparation method of a metal-semiconductor contact structure, wherein the metal-semiconductor contact structure is the metal-semiconductor contact structure according to claim 1, the preparation method of the metal-semiconductor contact structure comprising the steps of:
printing an electrode paste on the doped silicon-based semiconductor layer; the electrode paste comprises a glass phase material, metal particles, and an organic carrier;
pre-sintering the electrode paste at a high temperature, so that part of a surface of the doped silicon-based semiconductor layer forms the pit island, and forming an electrode precursor on the doped silicon-based semiconductor layer; wherein the electrode precursor comprises the glass phase material and the metal conductive particles packaged in the glass phase material;
performing laser-induced contact treatment on the electrode precursor to form the metal electrode, and the metal electrode and the doped silicon-based semiconductor layer forming the metal-semiconductor contact structure.

10. The preparation method of the metal-semiconductor contact structure according to claim 9, wherein, in the step of pre-sintering the electrode paste at a high temperature, a high sintering temperature is 700° C. to 850° C.
and/or,
in the step of performing laser-induced contact treatment, a reverse bias voltage of 9 V to 15 V is applied;
and/or,
conditions of the laser-induced contact treatment comprise a single wavelength spectrum having a wavelength of 500 nm to 1200 nm, a current density of 1000 $A/cm^2$ to 1400 $A/cm^2$, and a scanning rate of 35 m/s to 55 m/s.

11. The preparation method of the metal-semiconductor contact structure according to claim 9, wherein, the preparation method of the metal-semiconductor contact structure further comprises: performing light injection after the step of pre-sintering the electrode paste at a high temperature and before the step of performing laser-induced contact treatment on the electrode precursor;
or, the preparation method of the metal-semiconductor contact structure further comprises: performing light injection after the step of performing laser-induced contact treatment on the electrode precursor.

12. The preparation method of the metal-semiconductor contact structure according to claim 11, wherein, the step of light injection comprises:
primary heating of the electrode precursor, wherein a peak temperature of the primary heating is 200° C. to 600° C.;
secondary heating of the electrode precursor and illumination, wherein a peak temperature of the secondary heating is 100° C. to 350° C., an energy density of the illumination is 10 $kW/m^2$ to 100 $kW/m^2$, and a wavelength of the illumination is a continuous spectral band of 500 nm to 1200 nm.

13. A solar cell, wherein the solar cell comprises the metal-semiconductor contact structure according to claim 1.

14. The solar cell according to claim 13, wherein, the solar cell is a TOPCon cell and the solar cell comprises:
a silicon substrate;
a PN junction region, a first passivation layer, and a first metal electrode sequentially provided on a light-receiving surface of the silicon substrate in a direction away from the light-receiving surface, wherein the PN junction region is a first doped silicon-based semiconductor layer;
a passivation contact structure, a second passivation layer and a second metal electrode sequentially provided on a backlight surface of the silicon substrate in a direction away from the backlight surface, wherein the passivation contact structure comprises a tunneling passivation layer provided close to the silicon substrate and a doped silicon layer provided away from the silicon substrate, the doped silicon layer has a same conductivity type as the silicon substrate, and the doped silicon layer is a second doped silicon-based semiconductor layer;
the first metal electrode penetrates a portion of the first passivation layer into contact with the first doped silicon-based semiconductor layer so that the PN junction region and the first metal electrode form the metal-semiconductor contact structure, and/or, the second metal electrode penetrates the second passivation layer into contact with the doped silicon layer so that the doped silicon layer and the second metal electrode form the metal-semiconductor contact structure;
wherein, the first doped silicon-based semiconductor layer is formed by performing thermal diffusion of the doping element to the silicon substrate, or the first doped silicon-based semiconductor layer is a doped polysilicon layer or a doped amorphous silicon layer deposited on the light-receiving surface of the silicon substrate; and/or,
the first passivation layer is one or more of an aluminum oxide layer, a silicon oxide layer, a silicon oxynitride layer, or a silicon nitride layer deposited on the PN junction region; and/or,
the tunneling passivation layer is at least one of a silicon oxide layer, an amorphous silicon layer, a polycrystalline silicon layer, and a silicon carbide layer; and/or,
the second passivation layer is one or more of a silicon oxide layer, a silicon oxynitride layer, or a silicon nitride layer deposited on the second doped silicon-based semiconductor layer.

15. The solar cell according to claim 13, wherein, the solar cell is an HJT cell and the solar cell comprises:
- a silicon substrate;
- a first intrinsic amorphous silicon layer, a first doped silicon-based semiconductor layer, a first transparent conductive layer sequentially provided on a light-receiving surface of the silicon substrate, and a first metal electrode disposed on the light-receiving surface of the silicon substrate;
- a second intrinsic amorphous silicon layer, a second doped silicon-based semiconductor layer, a second transparent conductive layer sequentially provided on a backlight surface of the silicon substrate, and a second metal electrode disposed on the backlight surface of the silicon substrate;
- the first metal electrode and the first doped silicon-based semiconductor layer and the first transparent conductive layer forming the metal-semiconductor contact structure, and/or the second metal electrode and the second doped silicon-based semiconductor layer and the second transparent conductive layer forming the metal-semiconductor contact structure;
- wherein, the first intrinsic amorphous silicon layer comprises one or more of an intrinsic amorphous silicon layer, a hydrogenated amorphous silicon layer and a silicon oxide layer; and/or,
- the first doped silicon-based semiconductor layer is one or more doped silicon layers; and/or,
- the first transparent conductive layer is one or more of an indium tin oxide layer, an aluminum-doped zinc oxide layer, a zinc oxide layer, an indium oxide layer, or a tin oxide layer; and/or,
- the second intrinsic amorphous silicon layer comprises one or more of an intrinsic amorphous silicon layer and a hydrogenated amorphous silicon layer; and/or,
- the second doped silicon-based semiconductor layer is one or more doped silicon layers; and/or,
- the second transparent conductive layer is one or more of an indium tin oxide layer, an aluminum-doped zinc oxide layer, a zinc oxide layer, an indium oxide layer, or a tin oxide layer.

16. The solar cell according to claim 13, wherein, the solar cell is an IBC solar cell and the solar cell comprises:
- a silicon substrate;
- a tunneling passivation layer, a first doped silicon-based semiconductor layer, a first passivation layer, and a first metal electrode sequentially provided on an N-type conductive region of a backlight surface of the silicon substrate;
- the tunneling passivation layer, a second doped silicon-based semiconductor layer, a second passivation layer, and a second metal electrode sequentially provided on a P-type conductive region of the backlight surface of the silicon substrate; one layer of the first doped silicon-based semiconductor layer and the second doped silicon-based semiconductor layer has an N-type doping element and the other layer has a P-type doping element;
- wherein the first metal electrode penetrates the first passivation layer and contacts the first doped silicon-based semiconductor layer, so that the first metal electrode and the first doped silicon-based semiconductor layer form the metal-semiconductor contact structure, and/or, the second metal electrode penetrates the second passivation layer and contacts the second doped silicon-based semiconductor layer, so that the second metal electrode and the second doped silicon-based semiconductor layer form the metal-semiconductor contact structure.

17. A preparation method of a solar cell string comprising the steps of:
- welding a plurality of the solar cells according to claim 13 to form a cell string precursor;
- performing laser-induced contact treatment on the cell string precursor to obtain the solar cell string.

18. The preparation method of the solar cell string according to claim 17, wherein, in the step of performing laser-induced contact treatment on the cell string precursor,
- a voltage of applying reverse bias voltage is 10 V to 50 V; and/or,
- a wavelength of a laser is 500 nm to 1200 nm; and/or,
- an energy density of the laser is 10 kW/m$^2$ to 10000 kW/m$^2$; and/or,
- a scanning rate of the laser is 26 m/s to 65 m/s.

19. A solar cell string, wherein, the solar cell string is prepared by the preparation method of the solar cell string according to claim 17, and the solar cell string comprises the solar cells connecting in series and/or in parallel.

20. A photovoltaic module, wherein the photovoltaic module comprises the solar cell string according to claim 19.

* * * * *